US012771913B2

(12) United States Patent
Lieber et al.

(10) Patent No.: US 12,771,913 B2
(45) Date of Patent: Oct. 20, 2026

(54) FACIAL GESTURE RECOGNITION IN SWIR IMAGES

(71) Applicant: NEC Corporation Of America, Herzlia (IL)

(72) Inventors: Aaron Mark Lieber, Rishon le Zion (IL); Tsvi Lev, Tel-Aviv (IL)

(73) Assignee: NEC Corporation Of America, Herzlia (IL)

( * ) Notice: Subject to any disclaimer, the term of this patent is extended or adjusted under 35 U.S.C. 154(b) by 190 days.

(21) Appl. No.: 18/735,276

(22) Filed: Jun. 6, 2024

(65) Prior Publication Data

US 2024/0331444 A1 Oct. 3, 2024

Related U.S. Application Data

(63) Continuation of application No. 17/741,476, filed on May 11, 2022, now Pat. No. 12,067,805, which is a continuation-in-part of application No. 17/689,109, filed on Mar. 8, 2022, now Pat. No. 12,069,380.

(51) Int. Cl.

| | |
|---|---|
| ***H04N 23/11*** | (2023.01) |
| ***G06V 40/16*** | (2022.01) |
| ***H04N 23/56*** | (2023.01) |
| ***H04N 23/611*** | (2023.01) |
| ***H10F 39/18*** | (2025.01) |

(52) U.S. Cl.

CPC ........... *H04N 23/11* (2023.01); *G06V 40/171* (2022.01); *G06V 40/174* (2022.01); *H04N 23/56* (2023.01); *H04N 23/611* (2023.01); *H10F 39/184* (2025.01)

(58) Field of Classification Search

CPC ..... H04N 23/11; G06V 40/174; G06V 40/171

See application file for complete search history.

(56) References Cited

U.S. PATENT DOCUMENTS

| | | | |
|---|---|---|---|
| 5,835,271 | A | 11/1998 | Stump et al. |
| 6,215,519 | B1 | 4/2001 | Nayar et al. |
| 9,196,056 | B2 | 11/2015 | Hall |
| 10,298,908 | B2 | 5/2019 | Retterath |
| 10,972,655 | B1 | 4/2021 | Ostap |

(Continued)

FOREIGN PATENT DOCUMENTS

| | | |
|---|---|---|
| CA | 2729712 | 12/2009 |
| EP | 2731049 | 5/2014 |

(Continued)

OTHER PUBLICATIONS

Notice of Allowance Dated Sep. 18, 2024 From the US Patent and Trademark Office Re. U.S. Appl. No. 17/872,067. (16 Pages).

(Continued)

*Primary Examiner* — Hugh Maupin

(57) ABSTRACT

There is provided a system for analyzing images for facial expression recognition, comprising: at least one short wave infrared (SWIR) illumination element that generates SWIR illumination for illumination of a face of a person, at least one SWIR sensor that captures at least one SWIR image of the face under the SWIR illumination, and a non-transitory medium storing program instructions, which, when executed by a processor, cause the processor to analyze the at least one SWIR image for recognizing a facial expression depicted by the face.

23 Claims, 12 Drawing Sheets

(56) References Cited

U.S. PATENT DOCUMENTS

| | | | | |
|---|---|---|---|---|
| 11,117,570 | B1 | 9/2021 | Broggi | |
| 11,436,752 | B1 | 9/2022 | Rublee | |
| 2004/0005086 | A1* | 1/2004 | Wolff | G06V 40/161 382/284 |
| 2005/0185279 | A1 | 8/2005 | Mullen | |
| 2005/0278098 | A1 | 12/2005 | Breed | |
| 2008/0212182 | A1 | 9/2008 | Nilsen | |
| 2009/0190237 | A1 | 7/2009 | Silverstein et al. | |
| 2010/0322471 | A1 | 12/2010 | Treado et al. | |
| 2014/0129073 | A1 | 5/2014 | Ferguson | |
| 2015/0288948 | A1 | 10/2015 | Schamp et al. | |
| 2016/0086018 | A1 | 3/2016 | Lemoff | |
| 2017/0059398 | A1 | 3/2017 | Tennant et al. | |
| 2017/0191822 | A1 | 7/2017 | Becker et al. | |
| 2017/0270375 | A1 | 9/2017 | Grauer | |
| 2017/0328729 | A1 | 11/2017 | Zhu et al. | |
| 2017/0363887 | A1 | 12/2017 | Uyeno et al. | |
| 2018/0081094 | A1 | 3/2018 | Aikin et al. | |
| 2019/0095721 | A1 | 3/2019 | Ion et al. | |
| 2019/0120967 | A1 | 4/2019 | Smits | |
| 2019/0228031 | A1* | 7/2019 | Grundmann | G06V 40/174 |
| 2020/0103980 | A1* | 4/2020 | Katz | G06F 3/0484 |
| 2020/0255030 | A1 | 8/2020 | Yamamoto et al. | |
| 2020/0274998 | A1 | 8/2020 | Herman et al. | |
| 2020/0309688 | A1 | 10/2020 | Park et al. | |
| 2021/0190962 | A1 | 6/2021 | Maimon et al. | |
| 2021/0199769 | A1 | 7/2021 | Meylan | |
| 2021/0275084 | A1 | 9/2021 | Tversky et al. | |
| 2021/0323556 | A1 | 10/2021 | Matsumura et al. | |
| 2022/0003665 | A1 | 1/2022 | Swenson et al. | |
| 2022/0057519 | A1 | 2/2022 | Goldstein et al. | |
| 2022/0095923 | A1 | 3/2022 | Seybold et al. | |
| 2022/0137218 | A1 | 5/2022 | Onal et al. | |
| 2023/0247313 | A1 | 8/2023 | Paris et al. | |
| 2023/0288618 | A1 | 9/2023 | Lev | |
| 2023/0290000 | A1 | 9/2023 | Lev et al. | |
| 2023/0290181 | A1 | 9/2023 | Lieber et al. | |
| 2023/0292013 | A1 | 9/2023 | Lieber et al. | |
| 2023/0292015 | A1 | 9/2023 | Hoch | |
| 2023/0316789 | A1 | 10/2023 | Tsafrir et al. | |
| 2023/0326253 | A1 | 10/2023 | Shishido et al. | |
| 2025/0148641 | A1 | 5/2025 | Lev et al. | |

FOREIGN PATENT DOCUMENTS

| | | |
|---|---|---|
| EP | 3547277 | 10/2019 |
| ES | 2554549 | 12/2015 |
| JP | 2005-234686 | 9/2005 |
| JP | 2009-87303 | 4/2009 |
| JP | 2016-149063 | 8/2016 |
| JP | 2018-36734 | 3/2018 |
| JP | 2018-45386 | 3/2018 |
| JP | 2018-116589 | 7/2018 |
| JP | 2019-508131 | 3/2019 |
| JP | 2021-32855 | 3/2021 |
| JP | 2021-530069 | 11/2021 |
| SG | 191452 | 7/2013 |
| WO | WO 2008/129552 | 10/2008 |
| WO | WO 2011/101856 | 8/2011 |
| WO | WO 2014/208185 | 12/2014 |

OTHER PUBLICATIONS

Notice of Allowance Dated Aug. 23, 2024 from the US Patent and Trademark Office Re. U.S. Appl. No. 17/851,099. (20 pages).

Notice of Allowance Dated May 1, 2024 from the US Patent and Trademark Office Re. U.S. Appl. No. 17/741,476. (11 pages).

Notice of Allowance Dated May 22, 2024 from the US Patent and Trademark Office Re. U.S. Appl. No. 17/689,109. (19 Pages).

Official Action Dated Apr. 3, 2024 from the US Patent and Trademark Office Re. U.S. Appl. No. 17/741,476. (26 pages).

Official Action Dated Feb. 13, 2024 from the US Patent and Trademark Office Re. U.S. Appl. No. 17/689,109. (27 pages).

Official Action Dated May 21, 2024 From the US Patent and Trademark Office Re. U.S. Appl. No. 17/851,099. (34 Pages).

Official Action Dated Jan. 30, 2024 From the US Patent and Trademark Office Re. U.S. Appl. No. 17/872,086. (16 Pages).

Minace et al. "Deep-Emotion: Facial Expression Recognition Using Attentional Convolutional Network", ArXiv Preprint ArXiv: 1902.01019v1, p. 1-8, Feb. 4, 2019.

Steiner et al. "Design of an Active Multispectral SWIR Camera System for Skin Detection and Face Verification", Safety and Security Research Institute (ISF), Bonn-Rhein-Sieg University of Applied Sciences, Grantham-Allee 20, 53757 Sankt Augustin, Germany, Hindawi Publishing Corporation, vol. 2016 | Article ID 9682453, 1-16, Nov. 16, 2015.

Official Action Dated Jul. 1, 2024 From the US Patent and Trademark Office Re. U.S. Appl. No. 17/872,067. (42 Pages).

Notice of Allowance Dated Jun. 20, 2024 From the US Patent and Trademark Office Re. U.S. Appl. No. 17/872,086. (13 Pages).

Interview Summary Dated Jun. 16, 2025 from the US Patent and Trademark Office Re. U.S. Appl. No. 12/114,084. (14 pages).

Notice of Reason(s) for Rejection Dated May 12, 2026 From the Japan Patent Office Re. Application No. 2022-078054 and Its Translation Into English. (11 Pages).

Notice of Reason(s) for Rejection Dated Jan. 27, 2026 From the Japan Patent Office Re. Application No. 2022-078054 and Its Translation Into English. (14 Pages).

Steiner et al. "Reliable Face Anti-Spoofing Using Multispectral SWIR Imaging", 2016 International Conference on Biometrics (ICB), p. 1-8, Jun. 2016.

Xin ct al. "Recognition of Facial Expression by Natural Color and Infrared Images", FIT 2011: The 10th Forum on Information Technology, 3: 175-176, Aug. 22, 2011.

* cited by examiner

FACIAL GESTURE RECOGNITION IN SWIR IMAGES

RELATED APPLICATION

This application is a Continuation of U.S. patent application Ser. No. 17/741,476, filed on May 11, 2022, which is a Continuation-In-Part of U.S. patent application Ser. No. 17/689,109 filed on Mar. 8, 2022, the contents of which are incorporated herein by reference in their entirety.

FIELD AND BACKGROUND OF THE INVENTION

The present invention, in some embodiments thereof, relates to image processing and, more specifically, but not exclusively, to automated expression recognition of a face depicted in an image.

Facial expression/gesture understanding is very important in human communications. Attempts are being made to automatically recognize facial expressions depicted in images.

SUMMARY OF THE INVENTION

According to a first aspect, a system for analyzing images for facial expression recognition, comprises: at least one short wave infrared (SWIR) illumination element that generates SWIR illumination for illumination of a face of a person, at least one SWIR sensor that captures at least one SWIR image of the face under the SWIR illumination, and a non-transitory medium storing program instructions, which, when executed by a processor, cause the processor to analyze the at least one SWIR image for recognizing a facial expression depicted by the face.

In a further implementation form of the first aspect, further comprising at least one filter that filters out electromagnetic radiation at wavelengths which are mostly non-absorbed by water vapor in air depicted in the scene.

In a further implementation form of the first aspect, the at least one filter comprises a spectral narrow pass-band filter that one of: (i) passes wavelengths of about 1350-1450 nanometers (nm) and excludes wavelengths over about 1450 nm and below about 1350 nm, and (ii) passes wavelengths of about 1360 nm-1380 nm and excludes wavelengths over about 1380 nm and below about 1360 nm.

In a further implementation form of the first aspect, further comprising controlling the SWIR illumination element for generating a target illumination pattern for illumination of the face, and capturing the at least one SWIR image while the target illumination pattern is being generated.

In a further implementation form of the first aspect, the target illumination pattern is selected from a group comprising: pulsation, continuous, polarized, diffuse, and time-modulated.

In a further implementation form of the first aspect, the SWIR illumination element generates SWIR illumination at an intensity that does not triggers facial expressions indicating inconvenience, wherein a visible light illumination element generating visible light illumination at the intensity of the SWIR illumination element triggers facial expressions indicating inconvenience.

In a further implementation form of the first aspect, further comprising a visible light imaging sensor for capturing at least one visible light image, wherein the program instructions are for analyzing a combination of the at least one SWIR image and the at least one visible light image.

In a further implementation form of the first aspect, the at least one SWIR illumination element generates illumination at a band of wavelengths which are non-visible to a human eye, and the at least one SWIR sensor senses at the band of wavelengths which are non-visible to the human eye.

In a further implementation form of the first aspect, the band of wavelengths comprises about 1000-2000 nm.

In a further implementation form of the first aspect, the program instructions further comprise instructions for analyzing the at least one SWIR image for distinguishing facial hair on the face from surrounding skin.

In a further implementation form of the first aspect, the program instructions further comprise instructions for analyzing the at least one SWIR image for distinguishing makeup on the face from surrounding skin.

In a further implementation form of the first aspect, the at least one SWIR image comprises a plurality of SWIR frames of a SWIR video depicting an initial state of the face, changes from the initial state to the facial expression, and the face depicting the facial expression, wherein the program instructions comprise instructions for analyzing the plurality of SWIR frames for detecting the changes from the initial state to the facial expression.

In a further implementation form of the first aspect, the program instructions further comprise instructions for analyzing the at least one SWIR image for distinguishing regions of the face with high water content from neighboring regions of the face with low water content.

In a further implementation form of the first aspect, the regions of the face with high water content comprises lips and the regions of the face with low water content comprises skin surrounding the lips.

In a further implementation form of the first aspect, the program instructions further comprise instructions for analyzing the at least one SWIR image for distinguishing cars from neighboring hair.

In a further implementation form of the first aspect, the program instructions further comprise instructions for analyzing the at least one SWIR image for detecting at least one of: a tip of a nose, chin, and philtrum.

In a further implementation form of the first aspect, the program instructions further comprise instructions for analyzing the at least one SWIR image for distinguishing teeth from surrounding lips.

In a further implementation form of the first aspect, the program instructions further comprise instructions for analyzing the at least one SWIR image for detecting facial lines below eyes and/or in proximity to a nose.

In a further implementation form of the first aspect, the program instructions further comprise instructions for analyzing the at least one SWIR image for detecting regions of skin that are darker than surrounding neighboring skin.

According to a second aspect, a method of training a machine-learning (ML) model for facial expression recognition, comprises: creating a multi-record training dataset, wherein a record of the multi-record training dataset comprises: a plurality of facial expression features extracted from at least one SWIR image of a face of a sample individual under SWIR illumination, and a ground truth label indicating a facial expression depicted by the sample individual, and training a machine-learning model on the multi-record training dataset, for generating an outcome of a target facial expression of a target individual in response to an input of a plurality of target facial expression extracted from at least one SWIR image of a target face of the target individual under SWIR illumination.

According to a third aspect, a method of analyzing an image for facial expression recognition, comprises: feeding a plurality of target facial expression features extracted from at least one SWIR image of a target face of a target individual under SWIR illumination into a machine-learning model trained according to the second aspect, and obtaining a target facial expression of the target individual as an outcome of the machine-learning model.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
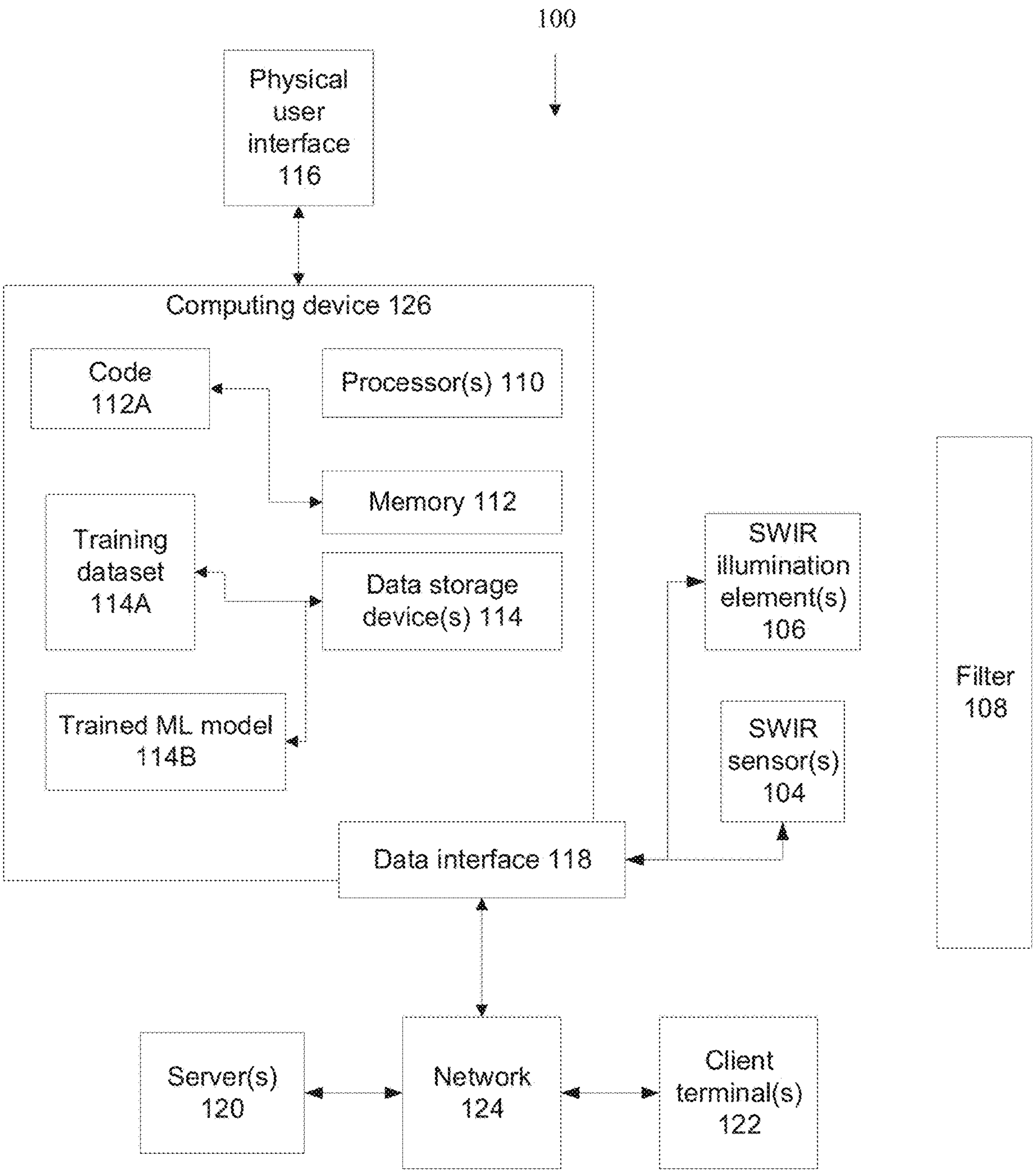
FIG. 1 is a block diagram of a system for analyzing SWIR images for facial expression recognition, in accordance with some embodiments of the present invention.

The present invention, in some embodiments thereof, relates to image processing and, more specifically, but not exclusively, to automated expression recognition of a face depicted in an image.

As used herein, the term "facial expression", "expressed emotions" and "facial gesture" are used interchangeably. Images described herein may be analyzed to determine facial expression, and/or expressed emotions, and/or facial gestures, for example, happy, sad, anger, confusion, pain, surprise, fear, disgust, neutral, and the like.

As used herein, the term SWIR is an exemplary implementation of wavelengths which are not visible to the human eye. It is noted that other wavelengths that are non-SWIR which are non-visible to the human eye may be used.

An aspect of some embodiments of the present invention relates to systems, methods, devices, and/or code instructions (stored on a data storage device and executable by one or more hardware processors) for automatic analysis of short wave infrared (SWIR) images for facial expression recognition. One or more SWIR illumination elements generate SWIR illumination for illumination of a face of a person. The SWIR illumination may be of higher intensity and/or directed at towards the face, since the SWIR illumination is not visible to the eye and/or does not harm the eye. One or more SWIR sensors capture one or more SWIR images of the face under the SWIR illumination. The SWIR illuminated images may be well illuminated under the SWIR illumination, in comparison for example, to visible light images which cannot achieve similar illumination intensity and/or orientation due to discomfort to the person and/or risk of damage to the eyes of the person. When higher intensity SWIR illumination and/or more direct SWIR illumination is applied, shorter camera exposure times may be selected and/or longer camera ranges may be obtained, and/or finer detail may be depicted in the captured SWIR images. The SWIR image(s) are automatically analyzed for recognizing a facial expression depicted by the face of the person, optionally based on an analysis of facial features extracted from the SWIR images. The SWIR images may provide high accuracy of the detected facial expression by the automatic facial expression recognition process. The higher accuracy may be achieved, for example, based on extracted facial features that are well depicted in the SWIR image, in comparison to visible light images, which may be under-illuminated and therefore corresponding facial features cannot be extracted, or extracted with similar reliability. In some embodiments, facial features that may be extracted from SWIR images have no corresponding extractable features from visible light illuminated images, since the SWIR extractable features are generated from effects of the SWIR illumination which are not present in the visible light images. For example, reflections from a tip of the nose, strong intensity of tissue with high water content compared to tissues with lower water content, and other features described herein. In some embodiments, a combination of features extracted from SWIR images and visible light images are analyzed.

At least some embodiments described herein address the technical problem of improving a computing device that analyzes images for automatic recognition of facial expressions. At least some embodiments described herein improve the technical field of automated image processing for automatic recognition of facial expressions. The improvement may be, for example, increased accuracy of the automatic recognition, reduced size of a training dataset for training a machine-learning model for automatic recognition, and/or extraction of facial features for automatic recognition that increase accuracy of the recognition. Using standard approaches, visible light sensors (e.g., standard cameras) are used to capture visible light images of faces of individuals. The images of the faces are analyzed to automatically recognize facial expressions. Visible light has several drawbacks. For example, visible light cannot be oriented towards the eyes of the individual and/or cannot be set at a high intensity. Such strong light and/or light directed towards the individual may cause inconvenience to the individual, which changes the facial expression of the person from a previous state (which was to be analyzed) to a current state indicating inconvenience. Moreover, use of intense light is limited by damage that may be done to the eyes. As such, use of external illumination to improve visibility without inconvenience is limited. In addition, under visible light, some facial features are technically challenging to identify, extract, and/or segment. For example, facial hair, makeup, and cars may be incorrectly identified, for example, confused with other tissue in proximity. In another example, some facial features may not be sufficiently visible under visible light to enable detection and/or extraction, for example, lines and/or creases on the face, a tip of a nose, a chin, a philtrum, tissues with high water content (e.g., eyeball, lips, nose openings), and the like. In another example, visible light source, whether natural (e.g., sun, fire) or artificial (e.g., light bulb, LED) may create uneven light and/or shadows, which may be technically challenging for automated detection and/or extraction of features. For example, shadows and/or uneven light may be incorrectly identified as facial expressions whey clearly are not so.

In at least some embodiments, the improvement is obtained by analyzing SWIR images of a face under SWIR illumination. One or more SWIR illumination elements may be controlled to generate a target SWIR illumination designed to depict facial features in captured SWIR images. The facial features under SWIR illumination may be features that are more distinct with respect to other facial feature in proximity, which may enable improved extraction and/or segmentation of the features. For example, improved ability to extract and/or segment one or more of the following: facial hair versus other skin in proximity, makeup, car versus hair, tip of nose, chin, lines and/or creases on the face, philtrum, and tissues with high water content (e.g., eyeball, lips, nose openings). The SWIR illumination is not visible to a human eye, and/or is safe to the human eye. This enables the SWIR illumination to be controlled and/or set at a variety of target illumination patterns, without triggering other facial expressions in the subjects being illuminated for image capture. For example, the SWIR illumination may be positioned and/or oriented directly in front of the face of the individual, and/or set at a strong illumination intensity, without the individual sensing the SWIR illumination. Since the individual does not sense the SWIR illumination, the individual is not inconvenienced, enabling the individual to display their true emotions on their face, rather than emotions in response to the inconvenience of an external illumination source. Furthermore, SWIR illumination may be set to provide even illumination and/or avoid shadows, which reduce or avoid technical challenges of extracting facial features and/or detecting facial features, as described herein. Since facial features under SWIR illumination appear more uniform in different subjects in comparison to facial features under visible light illumination, fewer facial features are needed under SWIR illumination in comparison to visible light illumination (e.g., to account for variations in different visible light illumination scenarios), reducing the size of a training dataset for training a machine-learning model for automatic recognition of facial expressions.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference is now made to FIG. 1, which is a block diagram of a system for analyzing SWIR images for facial expression recognition, in accordance with some embodiments of the present invention. Facial expression systems using visible light that rely on additional artificial illumination for illuminating faces is limited in that the artificial illumination cannot be uncomfortable to the eyes of the person and/or damage the eyes of the person. Strong light sources and/or light sources positioned towards the face of the person, which are needed to generate good images for automatic facial expression recognition, cannot be used. Components of the system described with reference to FIG. 1 and/or features of the method described with reference to FIGS. 2A-2C and/or FIGS. 3-10 use SWIR illumination, which can be of high intensity and/or directed towards the face, since SWIR illumination is not visible to the eye and/or does not harm the eye. The SWIR illumination enables generating well illuminated SWIR images that can be used for automatic facial expression recognition.

As used herein, the term "solar blind range" refers to the wavelength spectrum at which electromagnetic radiation (e.g., generated by sunlight and/or artificial light sources) is highly (e.g., mostly) absorbed in the atmosphere (e.g., by water vapor in air) and/or has low emission for example, the range of about 1350-1450 nm, optionally 1360-1380 nm.

Additional details of the solar blind range are described with reference to U.S. patent application Ser. No. 17/689,109 filed on Mar. 8, 2022, titled "SOLAR BLIND IMAGING", the contents of which are incorporated herein by reference in their entirety System 100 includes one or more SWIR sensor(s) 104 that capture SWIR image(s) of the scene at a SWIR wavelength range, optionally about 1000-2000 nanometers (nm). The SWIR wavelength range may include the solar blind range. Examples of SWIR sensor(s) 104 include: Plasmon based CMOR, balometer array based FIR, and 3D passive imaging.

It is noted that other imaging sensors that capture wavelengths that are non-visible to a human eye may be used, and/or other illumination elements that generate illumination at wavelengths that are non-visible to the human eye may be used. The illumination element generates illumination at wavelengths that are non-visible to the human eye and that are sensed by the imaging sensor for generating an image.

For clarity and simplicity of explanation, as used herein, the term SWIR sensor refers to one or more SWIR sensors, and the term SWIR illumination element refers to one or more SWIR illumination elements.

System 100 may include one or more SWIR illumination element(s) 106 that generate SWIR illumination at the SWIR wavelength range detectable by the SWIR sensor 104, optionally about 1000-2000 nm. SWIR illumination element 106 may generate at least some SWIR illumination at the solar blind range, i.e., having wavelengths in the range of about 1350-1450 nm, or about 1360 nm-1380 nm.

SWIR illumination element 106 may include artificial controlled illumination sources with emission in the non-visible range designed to generate a target illumination pattern, for example, pulsed, continuous, polarized, diffuse and/or stroboscopic. The intensity of SWIR illumination element 106 may be much higher than for example visible light sources, as the SWIR illumination generated by the SWIR illumination element 106 is not detected by the human eye and/or by other visible wavelength sensors. SWIR illumination at the wavelength range which is non-visible to the human eye, may be much stronger than sources in other wavelengths such as the visible light range, while still protecting the eye within safety limits and/or avoiding discomfort in the subject. When higher intensity SWIR illumination and/or more direct SWIR illumination is applied, shorter camera exposure times may be selected and/or longer camera ranges may be obtained, and/or finer detail may be depicted in the captured SWIR images.

System 100 may include one or more filters 108 that filters out electromagnetic radiation at wavelengths which are visible to the humane eye, for example, at wavelengths which are mostly non-absorbed by water vapor in air depicted in the scene. Filter 108 may pass electromagnetic radiation at wavelengths, which are mostly non-visible to the human eye, for example, absorbed by water vapor in air depicted in the scene.

Filter 108 is designed to exclude wavelengths that may cause glare and/or other artifacts when reflected off the scene, for example, in the visible light range.

Filter 108 may include a spectral narrow pass-band filter that passes wavelengths in the SWIR wavelength range of about 1000-2000 nm. Filter 108 may pass wavelengths in the solar blind range, for example, about 1350-1450 nanometers, or about 1360-1380 (nm). Filter may exclude excludes wavelengths over the SWIR wavelength range, of about 2000 nm, or over the solar blind range, of about 1450 nm, or about 1380 nm or other values. Filter may exclude wavelengths below the SWIR wavelength range, of about 1000 nm, or below the solar blind wavelength range about 1360 nm, or 1350 nm, or other values.

It is noted that in some embodiments, filter 108 may be omitted and/or built in to the SWIR sensors 104 and/or the SWIR illumination element 106. For example, the SWIR sensor(s) 104 is designed to capture electromagnetic energy having wavelengths in the solar blind range without necessarily requiring a filter, and/or using a built-in filter. In another example, the SWIR illumination element 106 is designed to generate electromagnetic energy having wavelengths in the solar blind range without necessarily requiring a filter, and/or using a built-in filter.

The SWIR wavelength range emitted by SWIR illumination element 106 includes at least a wavelength band passed by filter 108 and sensed by SWIR sensor 104.

SWIR illumination generated by SWIR illumination element 106 passes through filter 108 at some point before reaching SWIR sensor 104, on the path away from SWIR illumination element 106 towards objects of the scene (i.e., before being reflected off the objects at the scene), and/or on the path towards SWIR sensor 104 (i.e., after being reflected off the objects at the scene).

SWIR sensor 104 captures the SWIR illumination of the SWIR wavelength range generated by SWIR illumination element 106, which is passed by filter 108. SWIR sensor 104 generates one or more SWIR image of the scene, for example, as still images, and/or as a video (e.g., frames of the video).

Filter 108 may be positioned within a field of view (e.g., an entire field of view) of the SWIR sensor 104, for example, located in front of the SWIR sensor 104. SWIR illumination (e.g., generated by SWIR illumination element 106) reflecting off objects of the scene within the field of view passes through the filter 108 to reach the SWIR sensor 104. Optionally, all of the SWIR wavelengths that are sensed by the SWIR sensor 104 first pass through filter 108 before arriving at SWIR sensor 104.

SWIR illumination element 106 may be positioned behind filter 108, i.e., filter 108 is positioned within the field of illumination of SWIR illumination element 106, such that the SWIR illumination generated by SWIR illumination element 106 passes through filter 108 towards the scene before being reflected by objects in the scene. Alternatively, SWIR illumination element 106 may be positioned externally to filter 108 such that the generated SWIR illumination does not pass through filter 108 when transmitted towards the scene, but then passes through filter 108 before reaching SWIR sensor 104.

Alternatively or additionally, filter 108 may be an object that is transparent and/or substantially transmits the SWIR illumination, and is opaque and/or non-substantially transmits visible light, for example, an LCD display. In such implementation, SWIR illumination element 106 and filter 108 are located behind the LCD display, capturing illuminated SWIR images of a face of a subject viewing the LCD display, and analyzing the face depicted in the images for facial expression recognition during viewing of the LCD display.

Optionally, system 100 includes one or more of the following components:

- Hardware processor(s) 110, which may interface with SWIR sensor(s) 104 for accessing (e.g., receiving) SWIR image(s). Processor(s) 110 may interface with other components, described herein.

Processor(s) 110 may be implemented, for example, as a central processing unit(s) (CPU), a graphics processing unit(s) (GPU), field programmable gate array(s) (FPGA), digital signal processor(s) (DSP), and application specific integrated circuit(s) (ASIC). Processor(s) 110 may include a single processor, or multiple processors (homogenous or heterogeneous) arranged for parallel processing, as clusters and/or as one or more multi core processing devices.

- Memory 112, which stores code 112A for execution by processor(s) 110. Code 112A may include program instructions for implementing one or more features of the method described with reference to FIGS. 2A-2C and 3-10, for example, analyzing the SWIR for facial expression recognition. Memory 112 may be implemented as, for example, a random access memory (RAM), read-only memory (ROM), and/or a storage device, for example, non-volatile memory, magnetic media, semiconductor memory devices, hard drive, removable storage, and optical media (e.g., DVD, CD-ROM).

Code 112A may include instructions for detecting and/or extracting facial features in SWIR images and/or for generating other outcomes, which may be used by other processes. Code 112A may include instructions for generating a training dataset 114A and/or for training a machine-learning model 114B on training dataset 114A using a supervised and/or non-supervised approach. Examples of ML models include one or more neural networks of various architectures (e.g., artificial, deep, convolutional, fully connected), support vector machine (SVM), logistic regression, k-nearest neighbor, decision trees, and combinations of the aforementioned.

- Data storage device(s) 114, which may store data, for example, training dataset 114A that includes SWIR images of faces and/or extracted facial features labelled with ground truth labels of facial expression, and/or trained ML model 114B that is trained on training dataset 114A for generating an outcome of a target facial expression in response to an input of a target SWIR image of a target face and/or target facial features extracted from the target SWIR image. Data storage device(s) 114 may be implemented as, for example, a memory, a local hard-drive, virtual storage, a removable storage unit, an optical disk, a storage device, and/or as a remote server and/or computing cloud (e.g., accessed using a network connection).
- Physical user interface 116 that includes a mechanism for user interaction, for example, to enter data (e.g., select SWIR image for analysis) and/or to view data (e.g., the determined facial expression). Exemplary physical user interfaces 116 include, for example, one or more of, a touchscreen, a display, gesture activation devices, a keyboard, a mouse, and voice activated software using speakers and microphone. It is noted that the user interface (e.g., touch screen) of client terminal(s) 122 may be used as user interface 116.
- Data interface 118. Data interface 118 provides communication with external devices (e.g., server(s) 120 and/or client terminal(s) 122) optionally over a network 124, for example, for providing captured SWIR images and/or for providing results of analysis of SWIR images by code 112A and/or for receiving instructions for control of SWIR sensor(s) 104 and/or processor(s) 110 and/or other components. For example, the SWIR images and/or video captured by SWIR sensor(s) 104 may be streamed (e.g., in real time) over network 124 to server(s) 120 and/or client terminal(s) 122 for remote viewing and/or remote processing.

Data interface 118 may be implemented as, for example, one or more of, a network interface, a USB port, a network interface card, an antenna, a wireless interface to connect to a wireless network, a short range wireless connection, a physical interface for connecting to a cable for network connectivity, a virtual interface implemented in software, network communication software providing higher layers of network connectivity, and/or other implementations.

Network 124 may be implemented as, for example, the internet, a broadcast network, a local area network, a virtual network, a wireless network, a cellular network, a local bus, a point to point link (e.g., wired), and/or combinations of the aforementioned. It is noted at a cable connecting processor(s) 110 and another device may be referred to herein as network 124.

It is noted that one or more of processors 110, memory 112, data storage device 114, data interface 118, user interface 116, SWIR sensor(s) 104, SWIR illumination element(s) 106, and filter 108 may be part of a computing device 126 and/or may be integrated within a housing, for example, within a vehicle, behind a LCD of a kiosk, and for installation beside an entrance to a building.

Computing device 126, server(s) 120 and/or client terminal(s) 122 may be implemented as, for example one or more and/or combination of: a group of connected devices, a client terminal, a server, a computing cloud, a virtual server, a computing cloud, a virtual machine, a desktop computer, a thin client, a network node, a network server, and/or a mobile device (e.g., a Smartphone, a Tablet computer, a laptop computer, a wearable computer, glasses computer, and a watch computer).

Server(s) 120 may be implemented as, for example, a security server that may analyze the received SWIR images(s) (using code 112A stored on a memory associated with the respective server) and/or analyze the determined facial expression in an effort to increase security. For example, a person with a suspicious facial expression may be deemed as a security threat. In another example, server(s) may be implemented as a content (e.g., advertisements, videos, text, images) server that provides content in response to an input of determined facial expression. In another example, server may be implemented as an automated psychotherapy model, that provides psychotherapy exercises and/or advise according to an input of the determined facial expression. In another example, server is used for monitoring of patients (e.g., in patient, patient being treated at home), for example, the SWIR image and/or determined facial expression is monitored to determine whether the patient is comfortable, in pain, happy, or depressed, and the like.

Client terminal 122 (*s*) may be implemented as, for example, a smartphone of a user with a camera that monitors facial expression of a person, a camera connected to a computer installed at security checkpoints to check for suspicious facial expressions, and monitoring cameras located around a store that automatically monitor facial expressions of shoppers to generate alerts to employees such as a shopper with a confused look that are predicted to require help.

Communication between processor(s) 110 and/or server(s) 120 and/or client terminal(s) 122 over network 124 may be implemented, for example, via an application programming interface (API), software development kit (SDK), functions and/or libraries and/or add-ons added to existing applications executing on server(s) 120 and/or client terminal(s) 122, and/or an application for download and execution on server(s) 120 and/or client terminal(s) 122 that communicates with processor(s) 110, function and/or interface calls to code executed by processor(s) 110.

It is noted that code 112A may be stored on memory 112 located within computing device 126, for example, for local analysis and/or processing of SWIR images captured by SWIR sensor(s) 104. Alternatively or additionally, one or more portions of code 112A may be stored externally to computing device 126, for example, on a memory located in association with server(s) 120 and/or client terminal(s) 122, for example, SWIR images captured by SWIR sensor(s) 104 are provided over network 124 for remote analysis and/or processing by server(s) 120 and/or client terminal(s) 122.

Figure 2A:
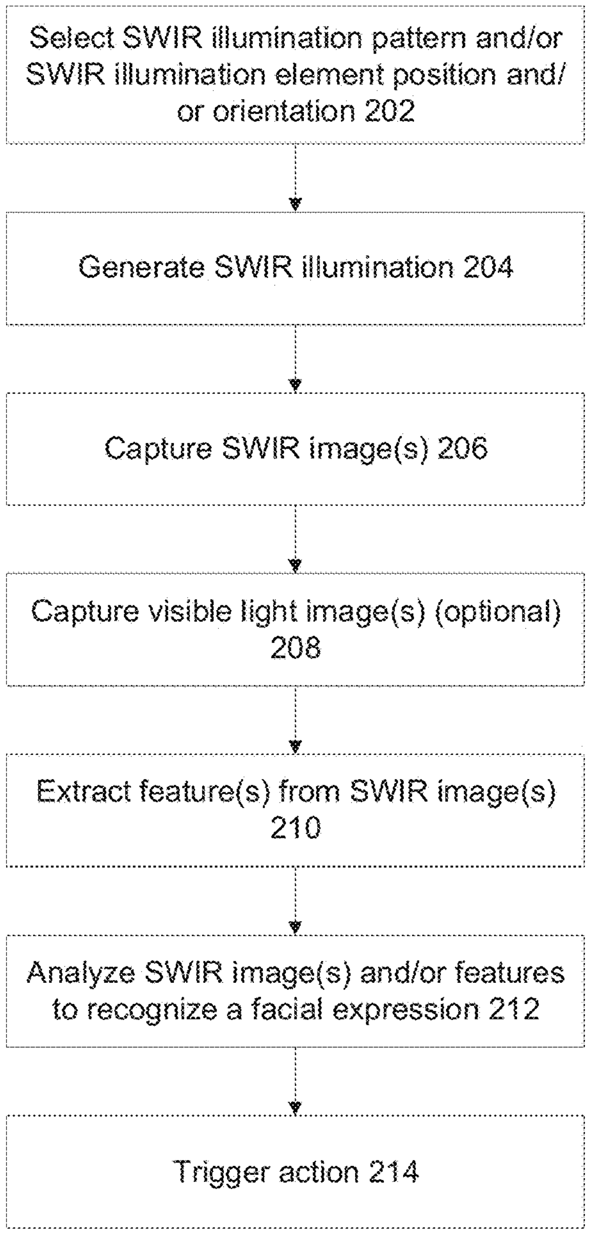
FIG. 2A is a flowchart of a method for analyzing SWIR images for facial expression recognition, in accordance with some embodiments of the present invention.

Reference is now made to FIG. 2A, which is a flowchart of a method for analyzing SWIR images for facial expression recognition, in accordance with some embodiments of the present invention. One or more features of the method described with reference to FIGS. 2A-2C and 3-10 may be implemented by processors and/or other components described with reference to system 100 of FIG. 1.

At 202, a SWIR illumination pattern and/or SWIR illumination element position and/or orientation may be selected. The SWIR illumination pattern and/or SWIR illumination element position and/or orientation may be selected for generating a target illumination pattern on a face of a person for generating SWIR images of well illuminated faces. The well illuminated faces may improve accuracy of an automated process of face expression recognition, for example, by improving ability to automatically extract features from the face.

Examples of target SWIR illumination patterns include: pulsation, continuous, polarized, diffuse, and time-modulated.

Examples of SWIR illumination element position and/or orientation include: face on, from high up pointing down, from lower down pointing up, and from one side pointing towards the face.

The target SWIR illumination pattern and/or illumination element position/orientation may be selected to improve illumination of certain features of the face, for example, a face on illumination may generate a reflective area on the tip of the nose, an illumination from high up pointing town may enhance forehead lines, and an illumination from a side towards the face may enhance pigmentations on checks.

The target SWIR illumination pattern may be selected to be at an intensity that does not triggers facial expressions indicating inconvenience. Even at higher intensity and/or face on illumination, the human eye cannot perceive SWIR illumination, and therefore, no reaction to the SWIR illumination is depicted in the facial expression. In contrast, a visible light illumination element generating visible light illumination at a corresponding intensity of the SWIR illumination would otherwise triggers facial expressions indicating inconvenience. For example, a strong face on visible light would cause a person to express pain on their face, look away from the illumination, close their eyes, and the like, all of which distort the actual facial expression of the person that would otherwise be depicted.

At 204, the SWIR illumination, optionally the target SWIR illumination pattern, is generated by the SWIR illumination element, which is optionally at the selected position and/or orientation.

The SWIR illumination is at the band of wavelengths, which are non-perceivable/non-visible by a human eye.

It is noted that other wavelengths, which are non-perceivable by the human eye may be used as an alternative to SWIR, and/or in addition to SWIR.

Exemplary SWIR illumination is in the band of wavelengths of about 1000-2000 nm.

Optionally, SWIR illumination is in the solar blind range, of about 1350-1450, or about 1360 nm-1380 nm.

One or more filters may be used to exclude non-SWIR wavelengths and/or non-solar blind wavelengths, and/or to include SWIR wavelengths and/or solar blind wavelengths.

At 206, one or more SWIR image(s) are captured by the SWIR sensor(s). The SWIR sensor captures SWIR image(s) depicting the face under the SWIR illumination.

Individual still SWIR images may be captured. A sequence of multiple frames of SWIR images may be captured, for example, a video.

When higher intensity SWIR illumination and/or more direct SWIR illumination is applied, as described herein, shorter camera exposure times may be selected and/or longer camera ranges may be obtained, and/or finer detail may be depicted in the captured SWIR images.

At 208, one or more visible light image(s) captured by a visible light sensor (e.g., standard camera, CMOS, CCD) of the face may be captured. It is noted that as described herein, due to risk of distorting the face expression of the person due to external artificial illumination, low intensity illumination and/or no artificial illumination is used.

The visible light images may be captured simultaneously with the SWIR images, or nearly in parallel (e.g., differ by a time interval that is short enough so that no changes in face expression are depicted) with the SWIR images. The visible light camera may be positioned at the same position and/or orientation as the SWIR sensor, or at a different position and/or orientation such as to capture different face features than the face features captured by the SWIR sensor.

At 210, features may be extracted from the SWIR image(s). Features may be, for example, hand crafted features and/or automatically learned features. Features may be explicitly defined, for example, by a set of rules, template, pattern, and the like. Features may be extracted, for example, using feature extraction approaches such as SIFT, HOG, and LBP. Features may be not explicitly defined, for example, extracted by filters and/or weights of layers of neurons within a neural network. For example, the SWIR image or patches thereof are fed into a trained neural network.

Features extracted from the SWIR images may be unique features that are not depicted in visible light images. Features extracted from the SWIR images may be features that have corresponding features depicted in visible light images, where the features are better depicted in SWIR images over visible light images, for example, better contrast with respect to surrounding tissue, higher accuracy of detection of the feature, higher accuracy in extraction, improved accuracy for detection of face expression.

Exemplary features are now described. The SWIR image(s) may be analyzed for extracting the exemplary features, for example, analyzing the SWIR image(s) for distinguishing the respective feature for extraction from surrounding face tissues (e.g., skin). The features extracted from the SWIR images may be more visible (e.g., better enhanced, higher contrast), for example, in comparison to visible light images. Exemplary features extracted from SWIR images include:

- Facial hair, for example, a beard, mustache, long hair from the top of the head falling over the face, side burns, and the like.
- Makeup on the face, lips, and/or eyes, for example, primer, blush, lipstick, foundation, concealer, powder, mascara, and the like.
- Distinguishing regions of the face with high water content from neighboring regions of the face with low water content. For example, regions of the face with high water content include lips, eyeball, and opening of nose. The regions of the face with low water content are skin surrounding the lips, eyeball, and opening of nose.
- Ears, that are distinguished from neighboring hair.
- A tip of a nose.
- Chin.
- Philtrum.
- Teeth, which may be distinguished from surrounding lips.
- Facial lines, for example, below eyes and/or in proximity to a nose.
- Regions of skin that are darker than surrounding neighboring skin, for example, moles, birthmarks, and regions of high pigmentation.

When visible light image(s) are captured with the SWIR images, features may be extracted from the visible light images.

At 212, the SWIR image(s) and/or features extracted from the SWIR image(s) are analyzed to recognize a facial expression depicted by the face.

Optionally, when visible light images are captured with the SWIR images, the visible light images and/or features extracted from the visible light images are analyzed in combination with the SWIR image(s) and/or features extracted from the SWIR image(s).

The analysis may be done, for example, by feeding the features and/or images into a trained machine-learning model, set of rules, and the like. Exemplary approaches for training the ML model and/or inference by the ML model are described herein. Examples of implementations of ML models include: one or more neural networks of various architectures (e.g., convolutional, fully connected, deep, encoder-decoder, recurrent, graph, combination of multiple architectures), support vector machines (SVM), logistic regression, k-nearest neighbor, decision trees, boosting, random forest, a regressor and the like.

Optionally, when a sequence of SWIR images are obtained, the sequence of SWIR images may be analyzed. For example, frames of a SWIR video depicting an initial state of the face that changes from the initial state to the facial expression may be analyzed for detecting the changes from the initial state to the facial expression. The analysis of the sequence may help increase accuracy of the recognized facial expression, for example, a sequence of features over a second or two indicating a process of formation of a smile are more likely to accurately detect the smile than a single image of the person smiling.

Optionally, the analysis is done for predicting a face expression before the final expression is determined, using initial frames from the sequence and/or individual images. For example, features indicating a start of a smile are detected before the smile appears, enabling prediction of the smile before the person smiles.

At 214, one or more actions may be automatically triggered in response to the detected face expression. For example:

- SWIR sensors and SWIR illumination elements may be positioned at areas sensitive for security, such as airport check-in, bank counters, and entrances to secure areas. Faces of individuals may be automatically monitored to detect face expressions indicative of likelihood of security threats, for example, nervous, anger, or drug-induced. Security personnel may be automatically alerted when such security threat face expression is detected, before the security breach is carried out.
- SWIR sensors and SWIR illumination elements may be positioned within a store. Faces of individual may be automatically monitored to detect face expression indicating that the person requires assistance, for example, confusion, upset, and anger. Employees may be automatically alerted to provide help to the person before the person even asks for help.
- Patients may be monitored using SWIR sensors and SWIR illumination elements. Faces of patients may be automatically monitored to determine the state of the patient, for example, comfortable, cold, hot, in pain, depressed, angry, and the like. Treatments may be automatically ordered accordingly. For example, for a patient determined to be in pain, an analgesic may be automatically ordered and/or administered.
- Users viewing a display, for example, watching television or surfing the web may be automatically monitored. Faces of users may be automatically monitored to determine the mood of the user. Content may be presented on the display according to the mood. For example, for a person in a sad mood, an advertisement for an anti-depressant may be presented. In another example, for a person in an angry mood, calming music may be played. In yet another example, for a person in a happy mood, a comedy movie may be presented.

Figure 2B:
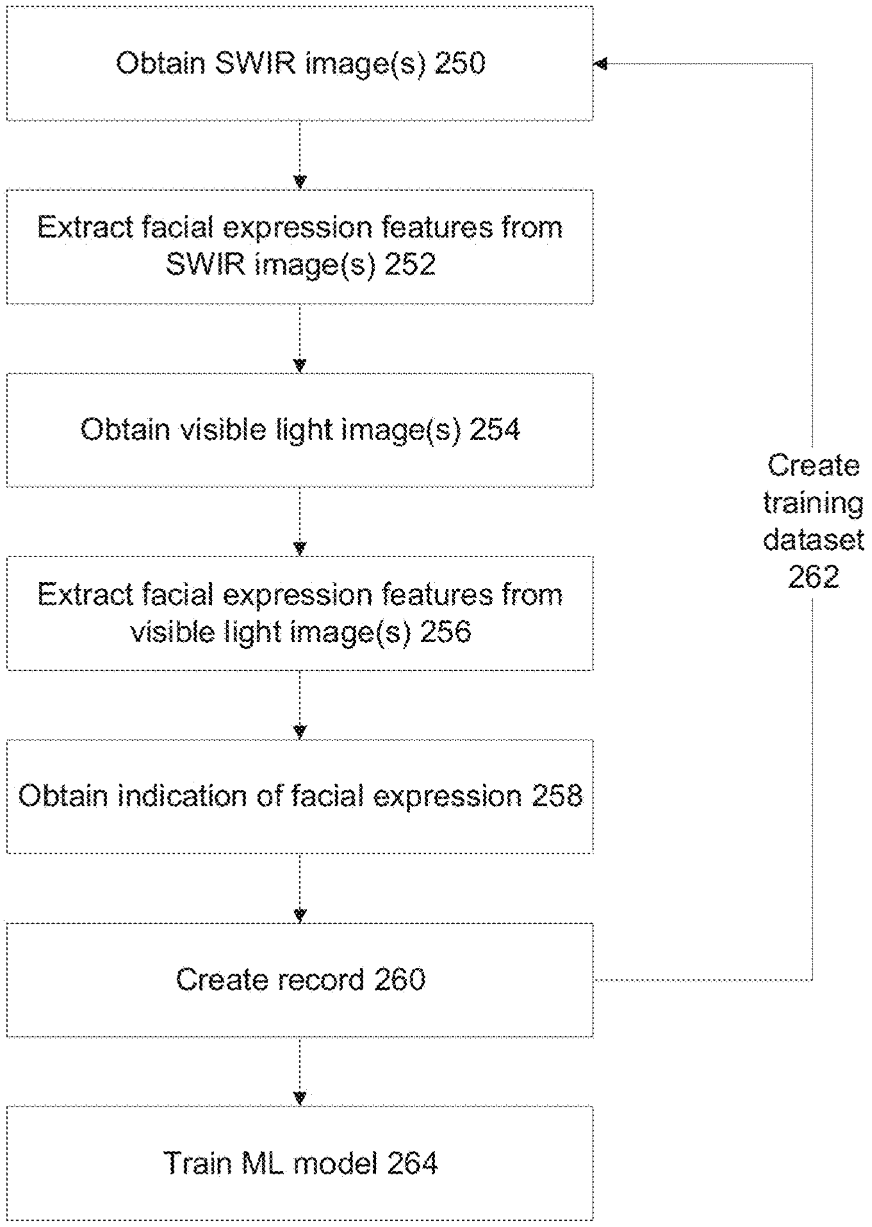
FIG. 2B is a flowchart of a method of training a machine-learning model for facial expression recognition using SWIR images, in accordance with some embodiments of the present invention.

Reference is now made to FIG. 2B, which is a flowchart of a method of training a machine-learning model for facial expression recognition using SWIR images, in accordance with some embodiments of the present invention.

At 250, one or more SWIR images depicting a face of a sample individual are obtained. The SWIR images are illuminated using SWIR illumination, optionally a selected illumination pattern, as described herein.

At 252, one or more facial expression features may be extracted from the SWIR image(s). Exemplary extractable facial features are described herein.

At 254, one or more visible light images depicting the face of the sample individual may be obtained. The visible light image(s) may be captured simultaneously (e.g., synchronized), or at approximately the same time (within a time interval) of the SWIR image(s).

At 256, features may be extracted from the visible light images. The features extracted from the visible light images may correspond to and/or be different from features extracted from the SWIR image(s).

At 258, an indication of a facial expression depicted by the sample individual is obtained. The indication may be a metadata, text, code, label, and the like. For example, smiling, sad, mad, crying, laughing, confused, and the like.

At 260, a record is created. The record includes a ground truth label indicating the facial expression depicted by the sample individual, and the SWIR images and/or the facial expression features extracted from the SWIR images. The record may include the visible light images and/or the facial expression features extracted from the visible light images.

At 262, features described with reference to 250-260 may be iterated, for different facial expressions and/or for different sample individual, for creating multiple records of a multi-record training dataset.

At 264, a machine-learning model is trained on the multi-record training dataset. The machine-learning model may be implemented as, for example, one or more neural networks of various architectures (e.g., convolutional, fully connected, deep, encoder-decoder, recurrent, graph, combination of multiple architectures), support vector machines (SVM), logistic regression, k-nearest neighbor, decision trees, boosting, random forest, a regressor, and the like. The ML model may be trained using a supervised approach.

Figure 2C:
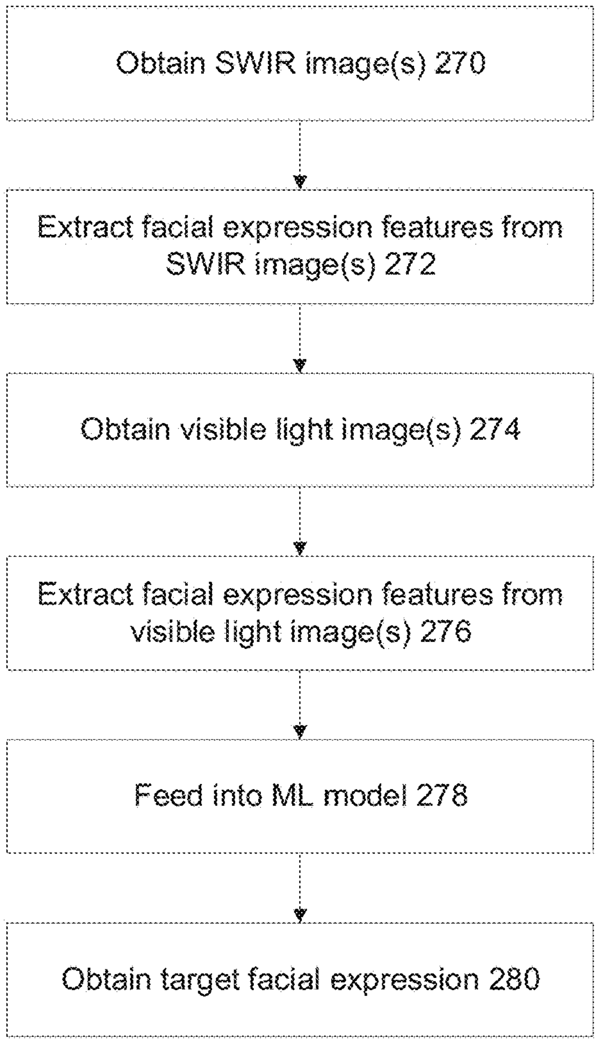
FIG. 2C is a flowchart of a method of analyzing a SWIR image for facial expression recognition, in accordance with some embodiments of the present invention.

Reference is now made to FIG. 2C, which is a flowchart of a method of analyzing a SWIR image for facial expression recognition, in accordance with some embodiments of the present invention.

At 270, one or more SWIR images depicting a face of a target individual are obtained. The SWIR images are illuminated using SWIR illumination, optionally a selected illumination pattern, as described herein.

At 272, one or more facial expression features may be extracted from the SWIR image(s). Exemplary extractable facial features are described herein.

At 274, one or more visible light images depicting the face of the target individual may be obtained. The visible light image(s) may be captured simultaneously (e.g., synchronized), or at approximately the same time (within a time interval) of the SWIR image(s).

At 276, features may be extracted from the visible light images. The features extracted from the visible light images may correspond to and/or be different from features extracted from the SWIR image(s).

At 278, the target facial expression features extracted from the SWIR image(s) and/or the SWIR image(s) are fed into the machine-learning model.

Optionally, the target facial expression features extracted from the visible light image(s) and/or the visible light image(s) are fed into the machine-learning model, in combination and/or simultaneously with the SWIR images and/or SWIR features.

The machine-learning model may be trained as described with reference to FIG. 2B.

At 280, a target facial expression of the target individual is obtained as an outcome of the machine-learning model.

Figure 3:
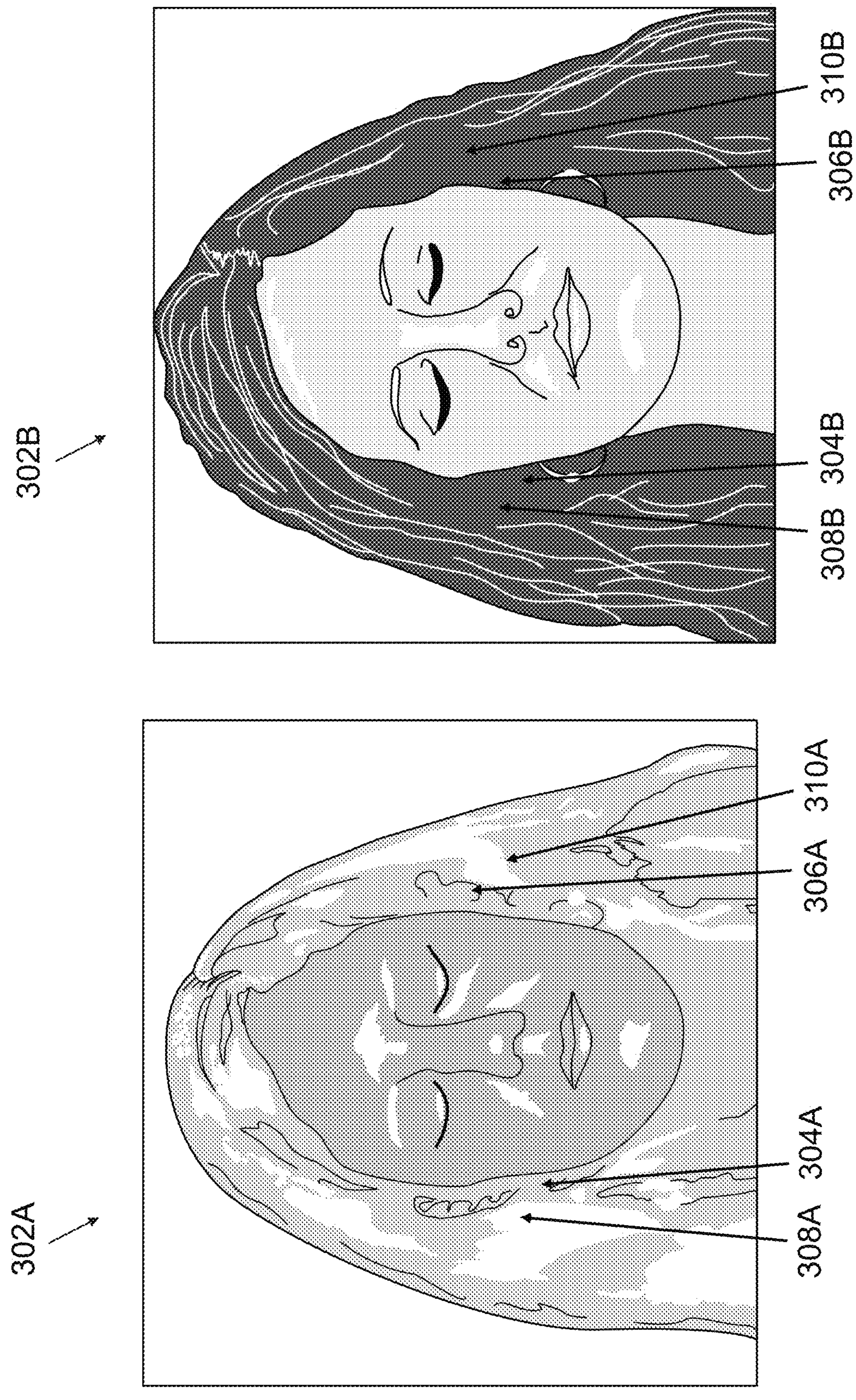
FIG. 3 is a SWIR image of a face of a person under SWIR illumination and a visible light image of the same person, in accordance with some embodiments of the present invention.

Reference is now made to FIG. 3, which is a SWIR image 302A of a face of a person under SWIR illumination and a visible light image 302B of the same person, in accordance with some embodiments of the present invention. FIG. 3 illustrates that in SWIR image 302A under SWIR illumination, cars 304A and 306A are more accurately detected and/or segmented from nearby hair 308A and 310A by an automated process (e.g., segmentation code, neural network, feature detector and/or extractor), which enables use of the cars as features for facial expression recognition. In contrast, cars 304B and 306B in visible light image 302B are difficult to distinguish from nearby hair 308B and 310B, for example, due to shadows between the cars and hair, and/or similarity of color between the cars and hair.

Figure 4:
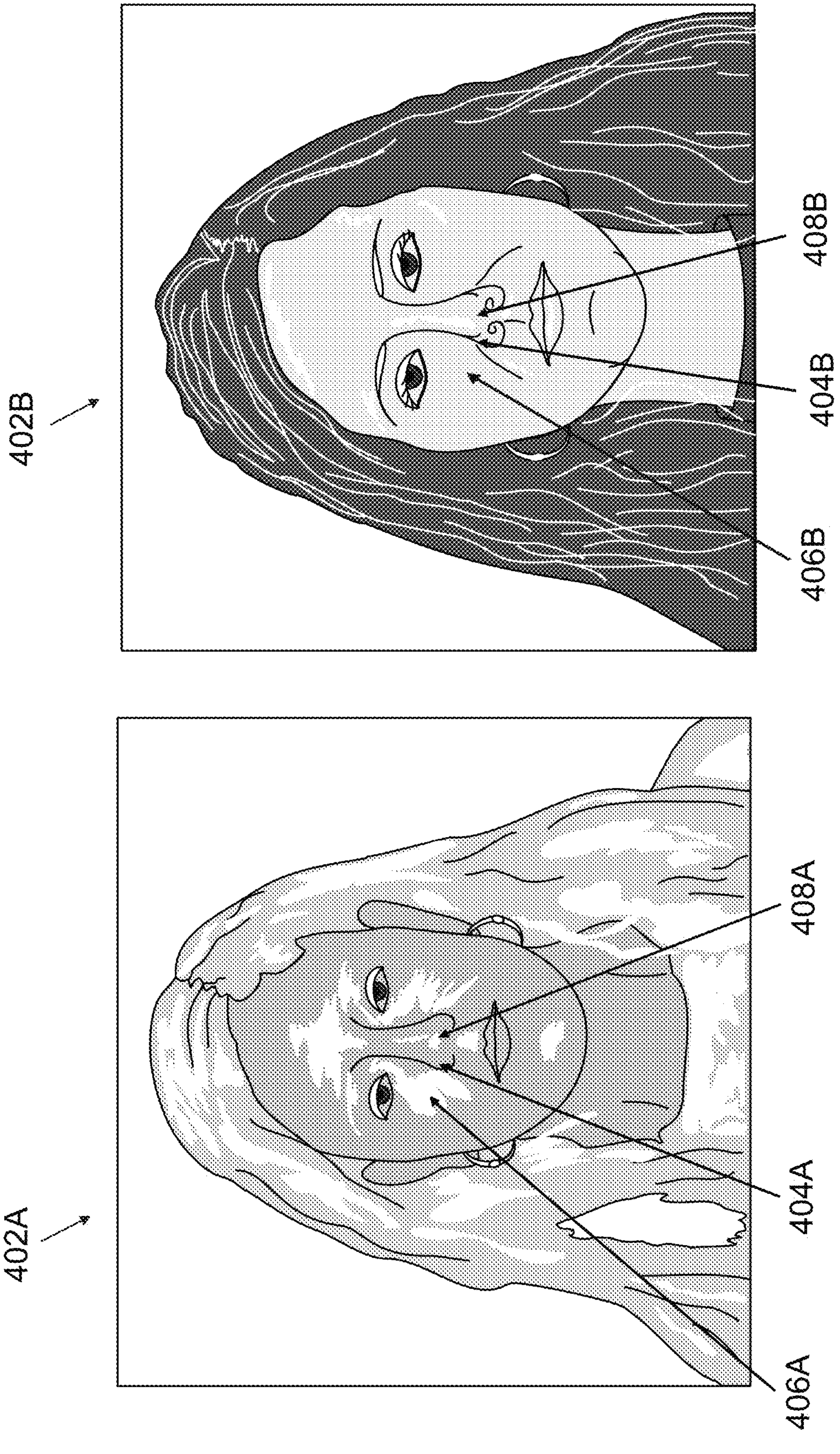
FIG. 4 is another SWIR image of a face of a person under SWIR illumination and a visible light image of the same person, in accordance with some embodiments of the present invention.

Reference is now made to FIG. 4, which is another SWIR image 402A of a face of a person under SWIR illumination and a visible light image 402B of the same person, in accordance with some embodiments of the present invention. FIG. 4 illustrates that in SWIR image 402A under SWIR illumination, a nose outlines 404A, face lines below eyes 406A, and a nose tip 408A are more accurately detected and/or segmented by the automated process, which enables use of these features for facial expression recognition. In contrast, nose outlines 404B, face lines below eyes 406B, and a nose tip 408B in visible light image 402B are difficult to distinguish from nearby skin, for example, due to shadows on the face, and/or similarity of color between the features and skin of the face.

Figure 5:
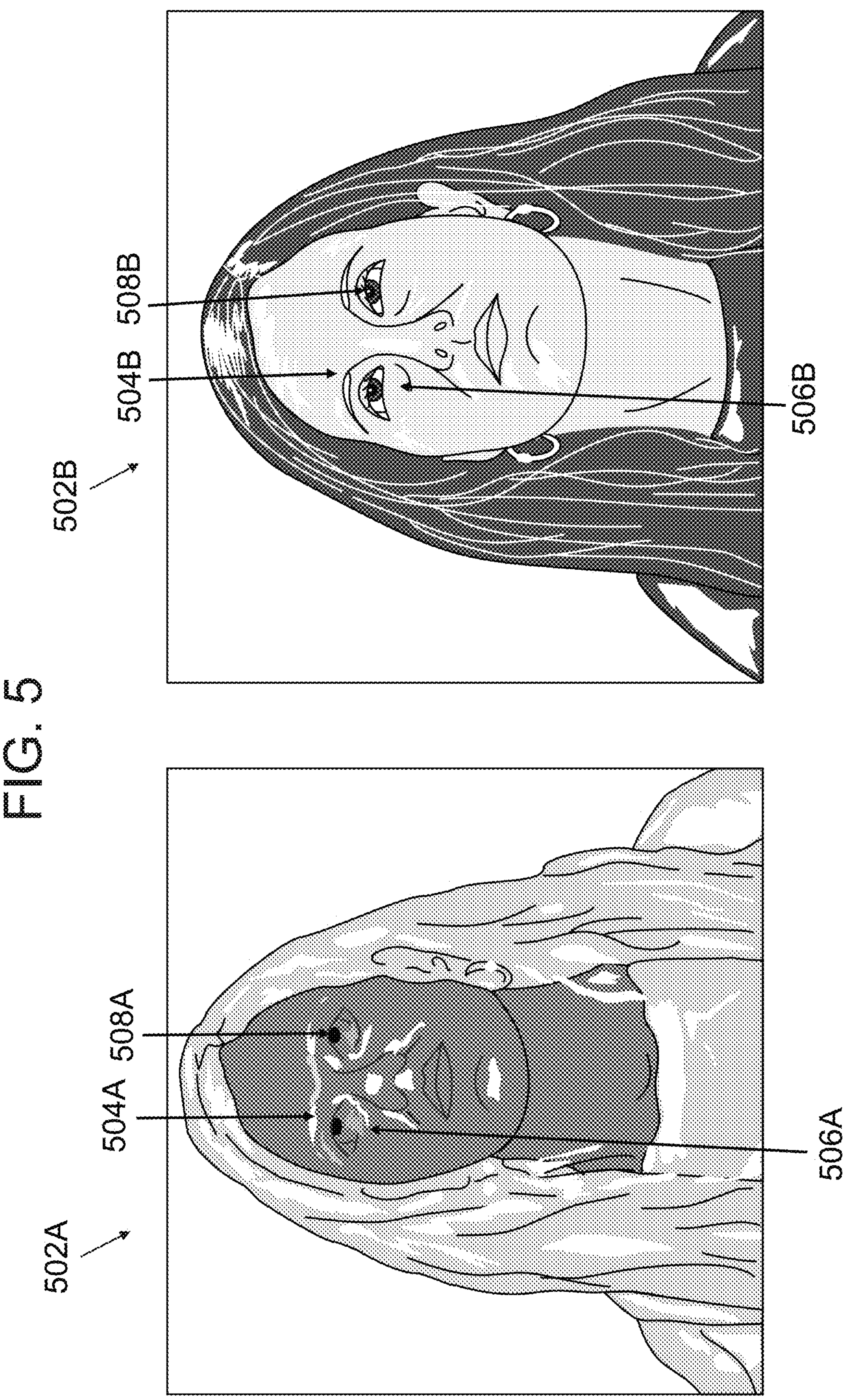
FIG. 5 is yet another SWIR image of a face of a person under SWIR illumination and a visible light image of the same person, in accordance with some embodiments of the present invention.

Reference is now made to FIG. 5, which is yet another SWIR image 502A of a face of a person under SWIR illumination and a visible light image 502B of the same person, in accordance with some embodiments of the present invention. FIG. 5 illustrates that in SWIR image 502A under SWIR illumination, features associated with looking up, for example, features such as eyebrows 504A, bottom eyelids 506A, and pupils 508A, are more accurately detected and/or segmented by the automated process. This enables use of these features for facial expression recognition. In contrast, eyebrows 504B, bottom eyelids 506B, and pupils 508B in visible light image 502B are difficult to distinguish from nearby skin, for example, due to shadows on the face, and/or similarity of color between the features and skin of the face.

Figure 6:
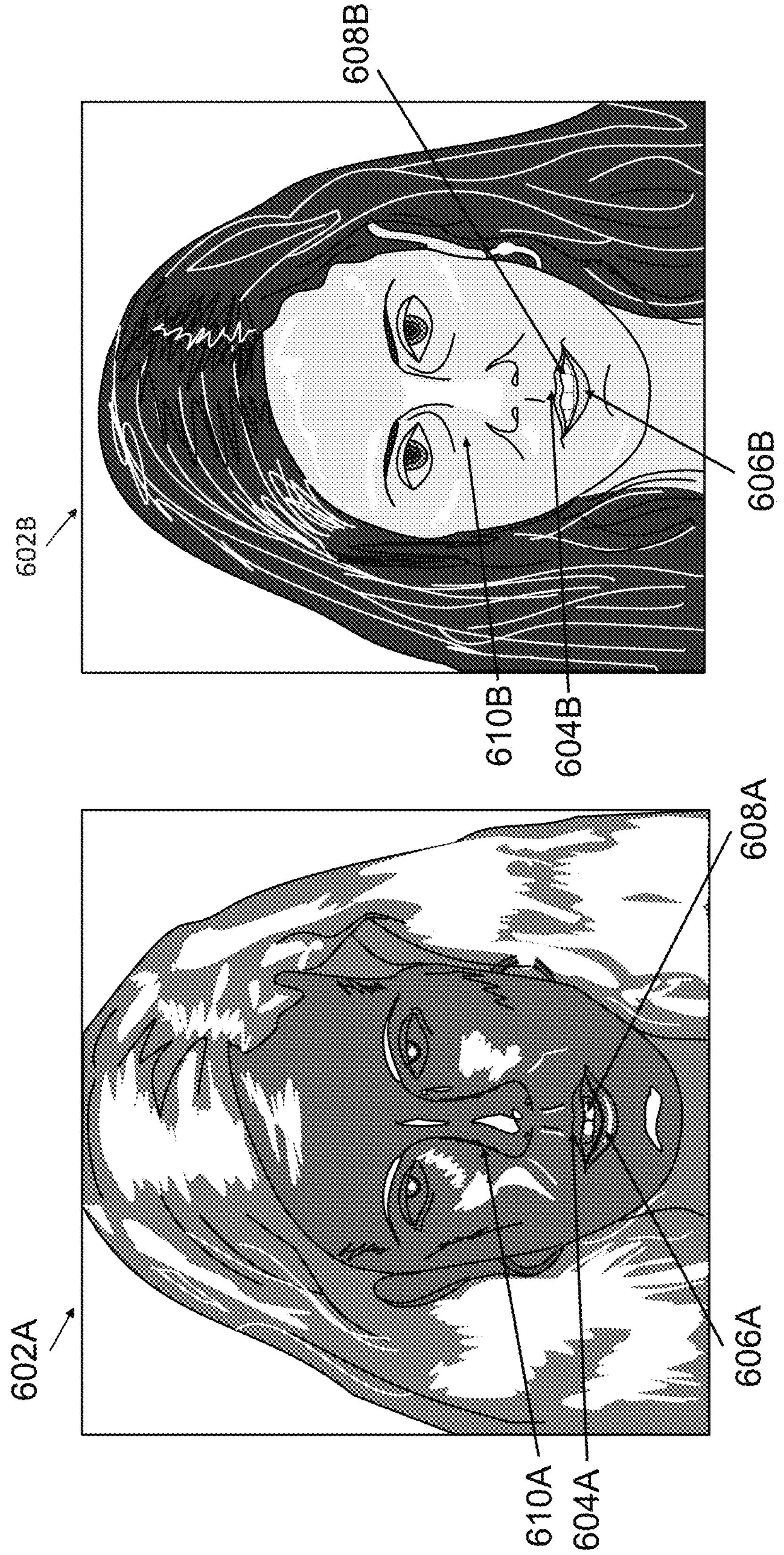
FIG. 6 is yet another SWIR image of a face of a person under SWIR illumination and a visible light image of the same person, in accordance with some embodiments of the present invention.

Reference is now made to FIG. 6, which is yet another SWIR image 602A of a face of a person under SWIR illumination and a visible light image 602B of the same person, in accordance with some embodiments of the present invention. FIG. 6 illustrates that in SWIR image 602A under SWIR illumination, contrast between lips 604A and 606A, and teeth 608A is larger, enabling these features to be more accurately detected and/or segmented by the automated process. This enables use of these features for facial expression recognition. In contrast, contrast between lips 604B and 606B, and teeth 608A in visible light image 602B is lighter, making it more difficult to distinguish from each other and/or from nearby skin, for example, due to shadows on the face, and/or similarity of color between the features and skin of the face. Moreover, in SWIR image 602A, an outline of a nose 610A is much sharper than an outline of a nose 610B in visible light image 602B, enabling the nose feature to be more accurately detected and/or segmented by the automated process.

Figure 7:
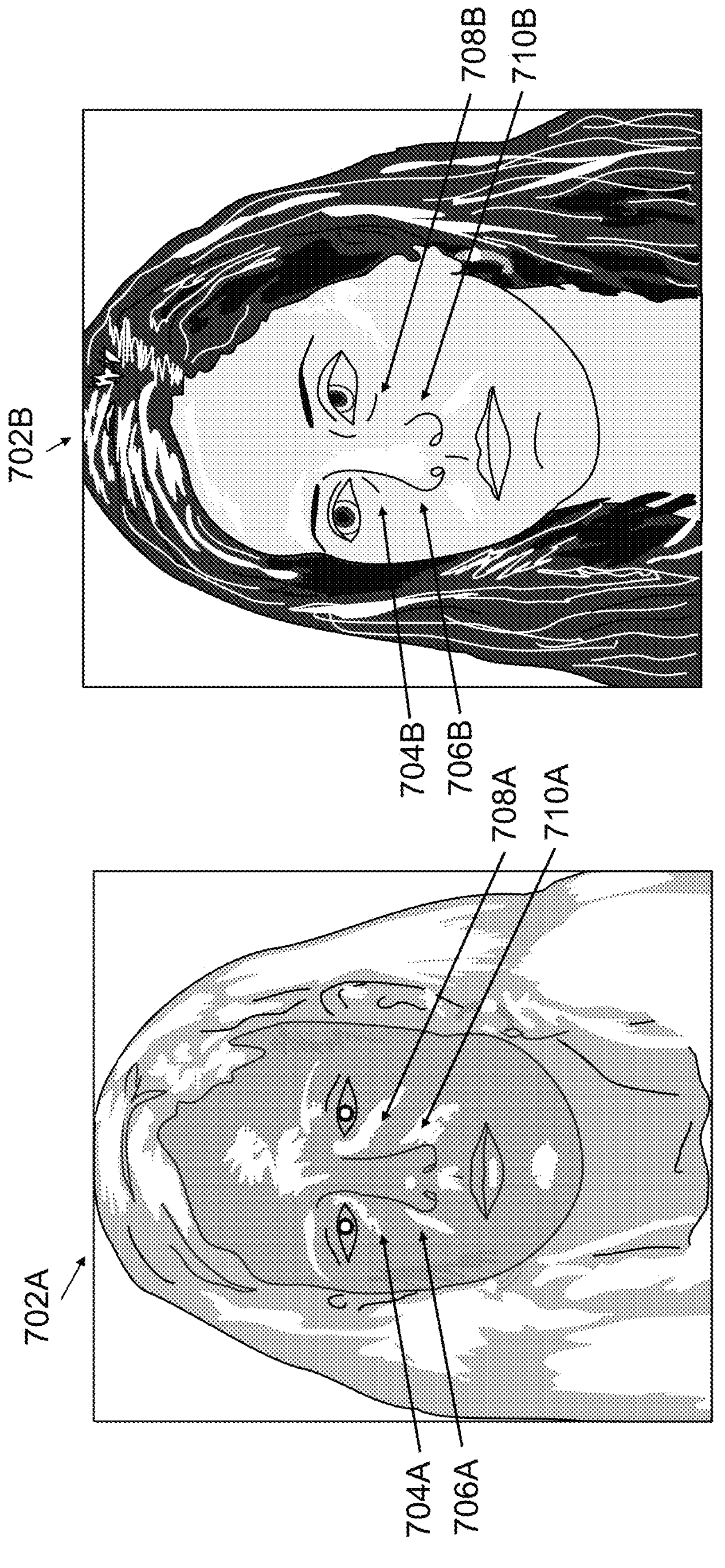
FIG. 7 is yet another SWIR image of a face of a person under SWIR illumination and a visible light image of the same person, in accordance with some embodiments of the present invention.

Reference is now made to FIG. 7, which is yet another SWIR image 702A of a face of a person under SWIR illumination and a visible light image 702B of the same person, in accordance with some embodiments of the present invention. FIG. 7 illustrates that in SWIR image 702A under SWIR illumination, face lines 704A, 706A, 708A, and 710A are more clearly depicted, enabling these features to be more accurately detected and/or segmented by the automated process. This enables use of these features for facial expression recognition. In contrast, face lines 704B, 706B, 708B, and 710B in visible light image 702B are lighter, making them more difficult to distinguish and/or to delincate from nearby skin, for example, due to shadows on the face, and/or similarity of color between the features and skin of the face.

Figure 8:
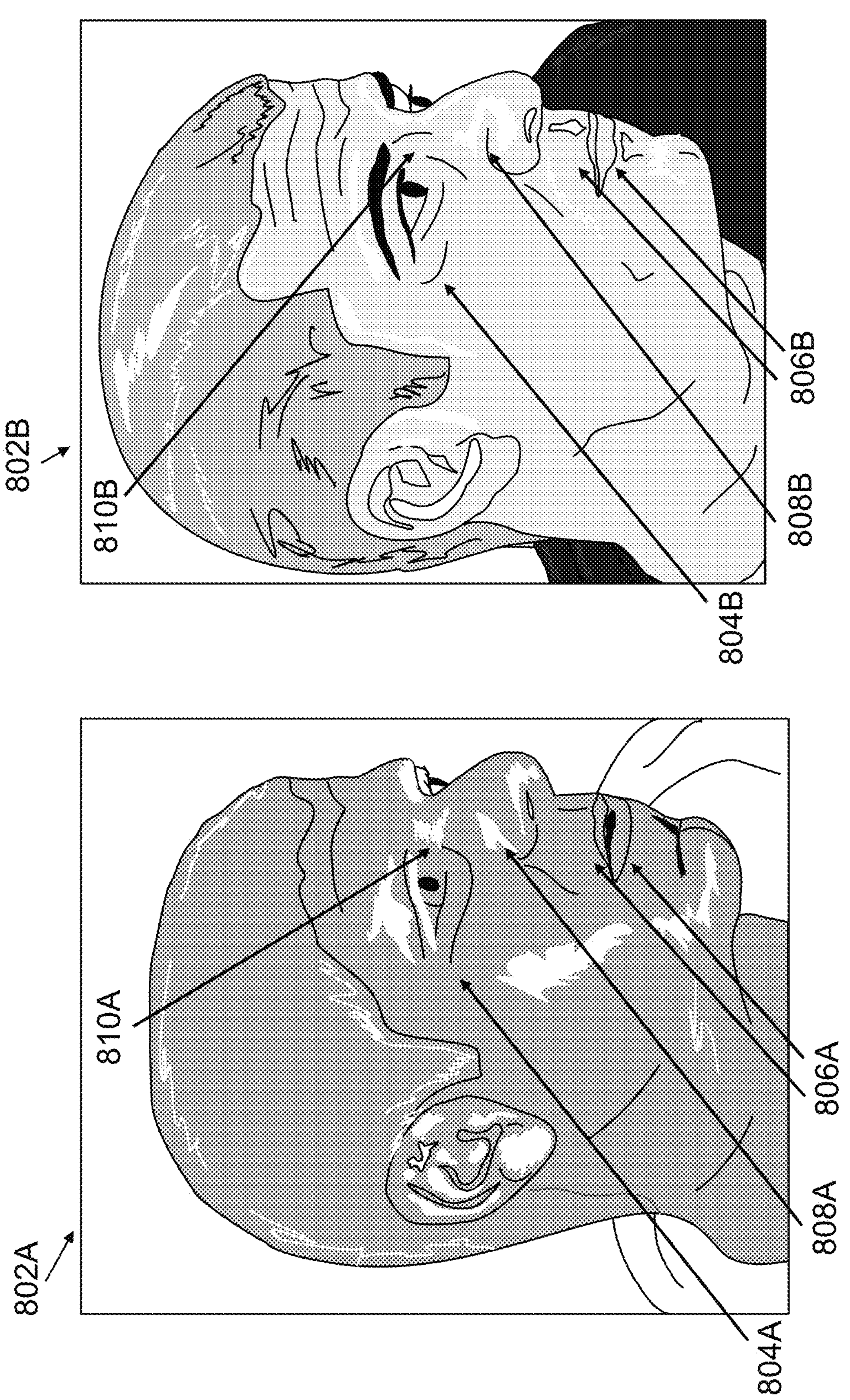
FIG. 8 is yet another SWIR image of a face of a person under SWIR illumination and a visible light image of the same person, in accordance with some embodiments of the present invention.

Reference is now made to FIG. 8, which is yet another SWIR image 802A of a face of a person under SWIR illumination and a visible light image 802B of the same person, in accordance with some embodiments of the present invention. FIG. 8 illustrates that in SWIR image 802A under SWIR illumination, skin pigmentation spots 804A, lip edges 806A, nose edges 808A, and inner eye 810A are more clearly depicted, enabling these features to be more accurately detected and/or segmented by the automated process. This enables use of these features for facial expression recognition. In contrast, skin pigmentation spots 804B, lip edges 806B, nose edges 808B, and inner eye 810B of visible light image 802B are lighter, making them more difficult to distinguish and/or to delineate from nearby skin, for example, due to shadows on the face, and/or similarity of color between the features and skin of the face.

Figure 9:
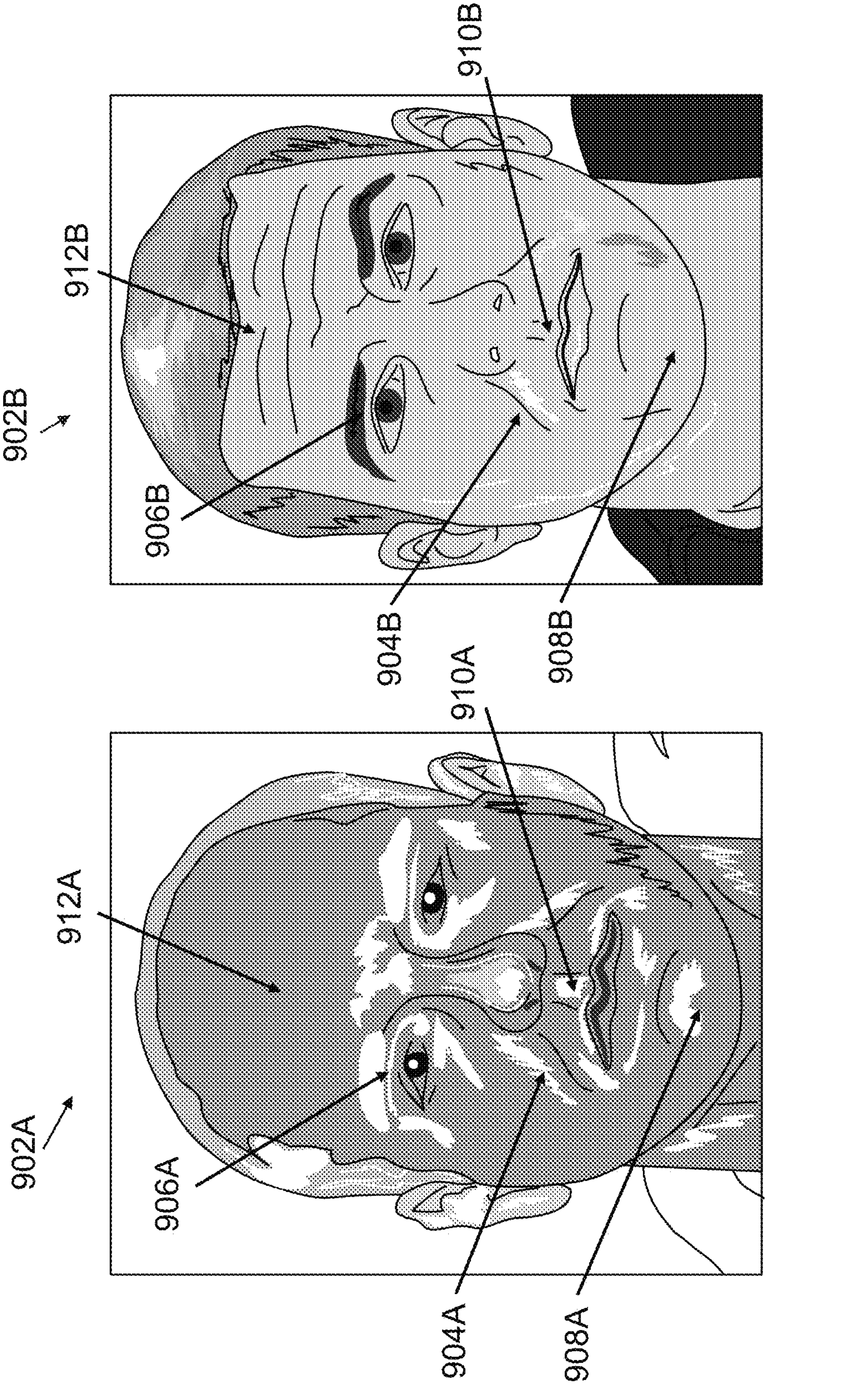
FIG. 9 is yet another SWIR image of a face of a person under SWIR illumination and a visible light image of the same person, in accordance with some embodiments of the present invention.

Reference is now made to FIG. 9, which is yet another SWIR image 902A of a face of a person under SWIR illumination and a visible light image 902B of the same person, in accordance with some embodiments of the present invention. FIG. 9 illustrates that in SWIR image 902A under SWIR illumination, face lines 904A, eyes, 906A, chin 908A, philtrum 910A, and forehead creases 912A are more clearly depicted, enabling these features to be more accurately detected and/or segmented by the automated process. This enables use of these features for facial expression recognition. In contrast, face lines 904B, eyes, 906B, chin 908B, philtrum 910B, and forehead creases 912B of visible light image 902B are more difficult to distinguish and/or to delincate from nearby skin, for example, due to shadows on the face, and/or similarity of color between the features and skin of the face.

Figure 10:
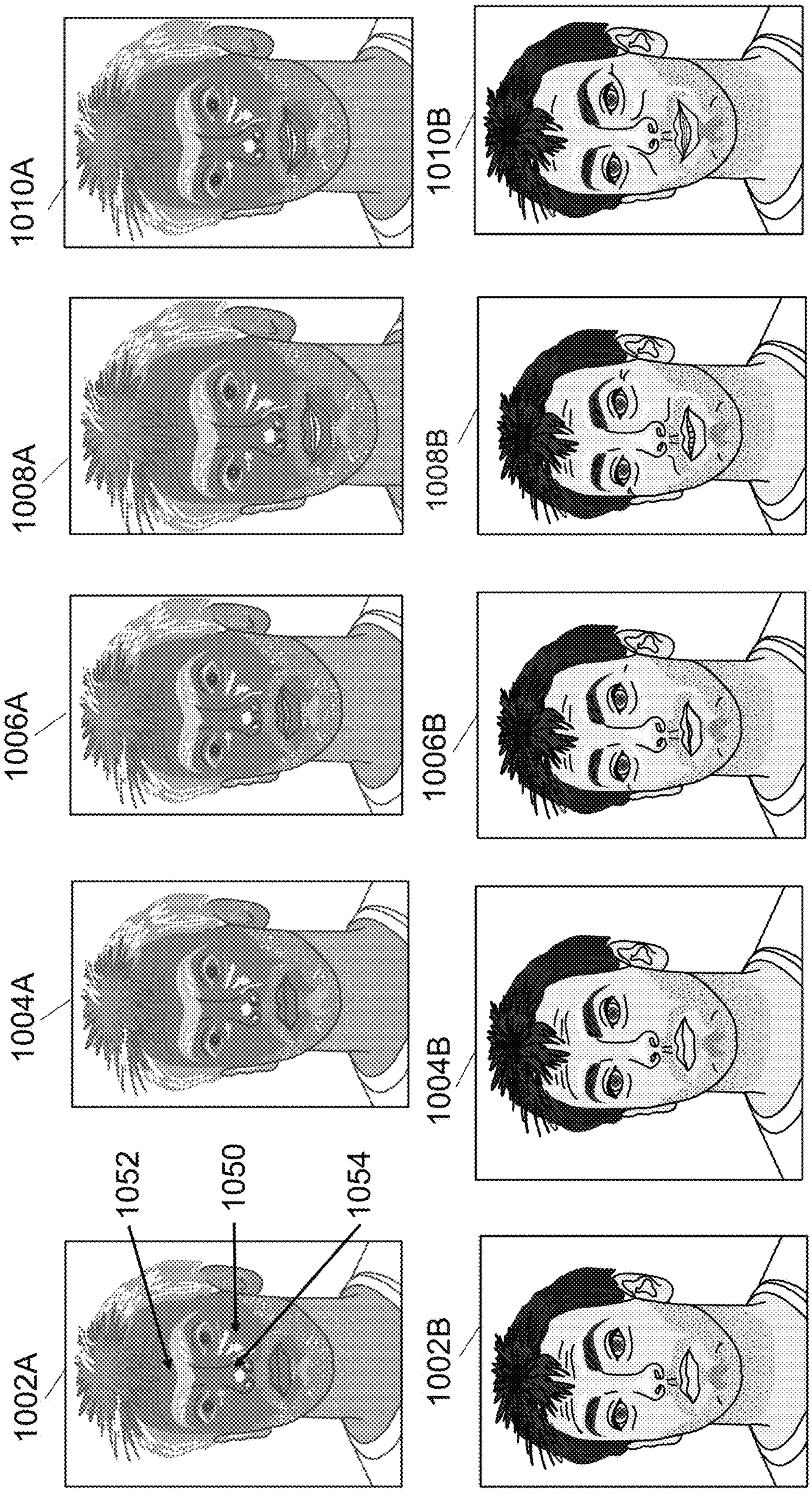
FIG. 10 is a sequence of SWIR images of a face of a person under SWIR illumination and a sequence of visible light image of the same person taken during a smiling motion, in accordance with some embodiments of the present invention.

Reference is now made to FIG. 10, which is a sequence of SWIR images 1002A, 1004A, 1006A, 1008A, and 1010A of a face of a person under SWIR illumination and a sequence of visible light image 1002B, 1004B, 1006B, 1008B, and 1010B of the same person taken during a smiling motion, in accordance with some embodiments of the present invention. SWIR images 1002A-10A are captured simultaneously with visible light images 1002B-1010B, to depict frame by frame correspondence. I.e., SWIR frame 1004A is taken at the same time as visible light frame 1004B. Images 1002A-B depict a state of the face before the smiling motion has commenced. Images 1010A-B depict the face during a smile, at the end of the smiling motion. Facial features described herein may be detected and/or tracked more easily in the sequence of SWIR images over the visible light images, for example, for detecting a start of the smiling motion, tracking formation of the smile, and when the smile is formed (i.e., end of the smiling motion), and/or for predicting the smiling motion in response to detection of the start of the smiling motion. The formation of the smile may be predicted prior to the smile occurring, based on detection of the start of the smile. It is noted that both SWIR images and visible light images may be used, for example, for improving reliability of detection.

SWIR image 1002A is labelled with indication of exemplary facial features that may be used to detect start of a smile and/or which may be sequentially tracked in frames depicting formation of the smile. An exemplary facial feature includes reflections from external part of checks 1050 and/or reflection from a bottom part of the forehead 1052, which are much weaker and/or imperceptible on the visible light image. Another exemplary facial feature includes a bright spot on a tip of the nose 1054, which may be tracked over the sequence of images to detect a small motion of the whole head to the right that occurs during the smiling motion. Using these and/or other features, the beginning of the smile is more easily detected in SWIR images over visible light images, which enables, for example, prediction of the smile prior to the smile appearing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant SWIR sensors will be developed and the scope of the term SWIR sensor is intended to include all such new technologies a priori.

As used herein the term “about” refers to ±10%.

The terms “comprises”, “comprising”, “includes”, “including”, “having” and their conjugates mean “including but not limited to”. This term encompasses the terms “consisting of” and “consisting essentially of”.

The phrase “consisting essentially of” means that the composition or method may include additional ingredients and/or steps, but only if the additional ingredients and/or steps do not materially alter the basic and novel characteristics of the claimed composition or method.

As used herein, the singular form “a”, “an” and “the” include plural references unless the context clearly dictates otherwise. For example, the term “a compound” or “at least one compound” may include a plurality of compounds, including mixtures thereof.

The word “exemplary” is used herein to mean “serving as an example, instance or illustration”. Any embodiment described as “exemplary” is not necessarily to be construed as preferred or advantageous over other embodiments and/or to exclude the incorporation of features from other embodiments.

The word “optionally” is used herein to mean “is provided in some embodiments and not provided in other embodiments”. Any particular embodiment of the invention may include a plurality of “optional” features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases “ranging/ranges between” a first indicate number and a second indicate number and “ranging/ranges from” a first indicate number “to” a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A system for analyzing images for facial expression recognition, comprising:

at least one processor executing a code for:

analyzing at least one short wave infrared (SWIR) image depicting a face of a person depicting a facial expression, the at least one SWIR image captured by at least one SWIR sensor; and identifying the face in the at least one SWIR image as a certain facial expression from a plurality of predefined facial expressions;

wherein the code further comprises instructions for analyzing the at least one SWIR image for at least one of:

(i) distinguishing regions of the face with high water content from neighboring regions of the face with low water content;
(ii) distinguishing teeth from surrounding lips;
(iii) detecting lines and/or creases on the face that are not visible or less visible on visible light images;
(iv) detecting facial lines below eyes and/or in proximity to a nose; and
(v) detecting regions of skin that are darker than surrounding neighboring skin, including at least one of: a mole, a birthmark, and a region of high pigmentation.

2. The system of claim 1, wherein the plurality of predefined facial expressions include: happy, sad, anger, confusion, pain, surprise, fear, and disgust.

3. The system of claim 1, further comprising:
extracting a plurality of facial features from the at least one SWIR image,
wherein analyzing comprises analyzing the plurality of facial features.

4. The system of claim 1, wherein the at least one SWIR image comprises a single SWIR image, wherein analyzing comprises analyzing the single SWIR image, and the identifying is in the single SWIR image.

5. The system of claim 1, further comprising at least one of: (i) at least one filter that filters out electromagnetic radiation at wavelengths which are mostly non-absorbed by water vapor in air, and (ii) at least one short wave infrared (SWIR) illumination element that generates SWIR illumination for illumination of a face of a person.

6. The system of claim 5, wherein the at least one filter comprises a spectral narrow pass-band filter that one of: (i) passes wavelengths about 1350-1450 nanometers (nm) and excludes wavelengths over about 1450 nm and below about 1350 nm, and (ii) passes wavelengths of about 1360 nm-1380 nm and excludes wavelengths over about 1380 nm and below about 1360 nm.

7. The system of claim 5, further comprising controlling the SWIR illumination element for generating a target illumination pattern for illumination of the face, and capturing the at least one SWIR image while the target illumination pattern is being generated.

8. The system of claim 5, wherein the SWIR illumination element generates SWIR illumination at an intensity that does not triggers facial expressions indicating inconvenience, wherein a visible light illumination element generating visible light illumination at the intensity of the SWIR illumination element triggers facial expressions indicating inconvenience.

9. The system of claim 5, wherein the at least one SWIR illumination element generates illumination at a band of wavelengths which are non-visible to a human eye, and the at least one SWIR sensor senses at the band of wavelengths which are non-visible to the human eye.

10. The system of claim 1, further comprising a visible light imaging sensor for capturing at least one visible light image, and code for analyzing a combination of the at least one SWIR image and the at least one visible light image.

11. The system of claim 1, wherein the code further comprises instructions for analyzing the at least one SWIR image for distinguishing facial hair on the face from surrounding skin.

12. The system of claim 1, wherein the code further comprises instructions for analyzing the at least one SWIR image for distinguishing long hair from a top of a head falling over the face from surrounding skin.

13. The system of claim 1, wherein the code further comprises instructions for analyzing the at least one SWIR image for distinguishing makeup on the face from surrounding skin.

14. The system of claim 1, wherein the at least one SWIR image comprises a plurality of SWIR frames of a SWIR video depicting an initial state of the face, changes from the initial state to the facial expression, and the face depicting the facial expression, wherein the code comprises instructions for analyzing the plurality of SWIR frames for detecting the changes from the initial state to the facial expression.

15. The system of claim 1, wherein the code comprises instructions for analyzing the at least one SWIR image for distinguishing regions of the face with high water content from neighboring regions of the face with low water content.

16. The system of claim 1, wherein the code further comprises instructions for analyzing the at least one SWIR image for distinguishing ears from neighboring hair.

17. The system of claim 1, wherein the code further comprises instructions for analyzing the at least one SWIR image for detecting reflections of SWIR illumination from at least one of: a tip of a nose, chin, and philtrum.

18. The system of claim 1, wherein the code comprises instructions for analyzing the at least one SWIR image for distinguishing teeth from surrounding lips.

19. The system of claim 1, wherein the code comprises instructions for analyzing the at least one SWIR image for detecting lines and/or creases on the face that are not visible or less visible on visible light images.

20. The system of claim 1, wherein the code comprises instructions for analyzing the at least one SWIR image for detecting facial lines below eyes and/or in proximity to a nose.

21. The system of claim 1, wherein the code comprises instructions for analyzing the at least one SWIR image for detecting regions of skin that are darker than surrounding neighboring skin, including at least one of: a mole, a birthmark, and a region of high pigmentation.

22. A method of training a machine-learning model for facial expression recognition, comprising:
creating a multi-record training dataset, wherein a record comprises:
at least one SWIR image of a face of a sample individual depicting a facial expression captured by at least one SWIR sensor, and
a ground truth label indicating a certain facial expression depicted by the sample individual, the certain facial expression is identified from a plurality of predefined facial expressions; and
training a machine-learning model on the multi-record training dataset, for generating an outcome of a target facial expression identifying a target individual selected from the plurality of predefined facial expressions in response to an input of at least one SWIR image of a target face of the target individual under SWIR illumination;
wherein said training comprises training said machine-learning model for at least one of:
(i) distinguishing regions of the face with high water content from neighboring regions of the face with low water content;
(ii) distinguishing teeth from surrounding lips;
(iii) detecting lines and/or creases on the face that are not visible or less visible on visible light images;
(iv) detecting facial lines below eyes and/or in proximity to a nose; and (v) detecting regions of skin that are darker than surrounding neighboring skin, including at least one of: a mole, a birthmark, and a region of high pigmentation.

23. A method of analyzing an image for facial expression recognition, comprising:

feeding at least one SWIR image of a target face of a target individual under SWIR illumination into a machine-learning model trained as in claim 22; and obtaining a target facial expression identifying the target individual from the plurality of predefined facial expressions as an outcome of the machine-learning model.

* * * * *